United States Patent [19]
Kirschner

[11] 4,035,825
[45] July 12, 1977

[54] THYRISTOR WITH BRANCHED BASE

[75] Inventor: Fritz Kirschner, Lohhof, Germany

[73] Assignee: Siemens Aktiengesellschaft, Munich, Germany

[21] Appl. No.: 636,283

[22] Filed: Nov. 28, 1975

[30] Foreign Application Priority Data

Dec. 3, 1974 Germany ............................ 2457106

[51] Int. Cl.² .................................... H01L 29/74
[52] U.S. Cl. ................... 357/38; 357/20; 357/34; 357/36
[58] Field of Search ............... 357/20, 38, 34, 36

[56] References Cited

U.S. PATENT DOCUMENTS

| | | | |
|---|---|---|---|
| 3,619,738 | 11/1971 | Otsuka | 357/38 |
| 3,641,403 | 2/1972 | Nakata | 357/38 |
| 3,688,164 | 8/1972 | Tsukuda et al. | 357/38 |
| 3,858,236 | 12/1974 | Schafer et al. | 357/38 |
| 3,906,545 | 9/1975 | Schlangnotto et al. | 357/38 |
| 3,914,781 | 10/1975 | Matsushita et al. | 357/38 |

*Primary Examiner*—Michael J. Lynch
*Assistant Examiner*—Joseph E. Clawson, Jr.
*Attorney, Agent, or Firm*—C. L. Menzemer

[57] ABSTRACT

The present invention pertains to a thyristor device comprising a semiconductor body having at least one emitter zone positioned at a major surface of the body. A base zone shares a portion of the major surface with the emitter zone and extends under the entirety of the emitter zone. The base zone and emitter zone form a PN junction at their interface. The portion of the base zone under the emitter zone has a plurality of low resistivity branches which have their common origin in the portion of the base zone located directly under the major surface.

5 Claims, 5 Drawing Figures

THYRISTOR WITH BRANCHED BASE

BACKGROUND OF THE INVENTION

1. Field of the Invention

The present invention pertains to semiconductor switching devices and in particular to semiconductor thyristor devices having branched base structures.

2. Description of the Prior Art

It is known in the art to construct thyristor devices with low resistivity branches in the base zone. Such branches produce a reduction in the transverse resistance of the base which has several favorable effects. One favorable effect is a reduction in turn-off time. A second favorable effect is an improved capability for operation in the gate turn-off mode.

Briefly, gate turn-off is achieved by impressing a voltage on the base of a thyristor device operating in its low impedance state, which voltage has a polarity with respect to the emitter opposite to that normally used to turn on the device.

There are two families of structures in the prior art which provide such low resistivity branches.

First, there are thyristors wherein the base zone has branches which pass through the emitter zone emerging at the semiconductor surface. Such devices require geometrically complex electrodes.

Second, in an effort to eliminate complex electrodes, devices have been proposed wherein the base zone comprises low resistivity branches running underneath the emitter zone, the low resistivity being produced by an epitaxial process which results in nonuniform doping concentration relative to the same level of the base zone separating the branches.

The present invention overcomes the disadvantages of such prior art devices and provides a fast-switching thyristor device suitable for operation in the gate turn-off mode which comprises a novel emitter-base structure having low resistivity branches in the base zone. The present invention provides a two-level emitter zone, which renders unnecessary the above-described, nonuniform, epitaxially- produced doping concentration.

SUMMARY OF THE INVENTION

The present invention is a thyristor device comprising a body of semiconductor material and electrical conductor means;

said body of semiconductor material comprising at least one emitter zone disposed along a major surface of said body, a base zone disposed in said body adjacent to and in PN junction forming relationship with said emitter zone, said base zone having a first portion under said emitter zone and a second portion emerging at said major surface; said electrical conductor means comprising an emitter electrode affixed to said emitter zone at said major surface, a base electrode affixed to said second portion of said base zone at said major surface;

a plurality of branches in said first portion of said base zone, said branches having a common origin in said second portion of said base zone, said emitter zone having portions of a first thickness above said branches, said emitter zone having portions of a second thickness separating said branches, said second thickness exceeding said first thickness, said base zone having a doping concentration increasing uniformly in a direction toward said major surface.

DESCRIPTION OF THE PREFERRED EMBODIMENTS

Figure 1:
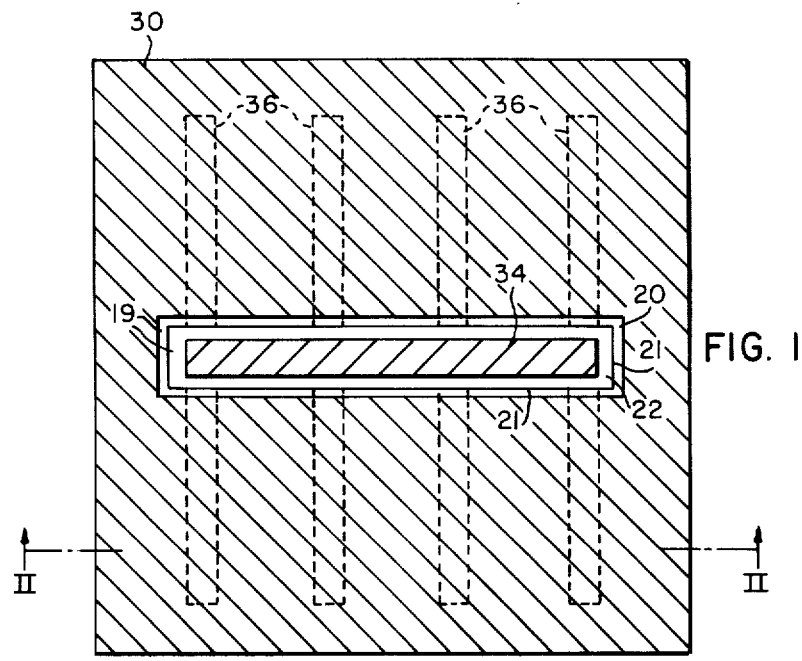
FIG. 1 is a plan view of a thyristor device made in accordance with the present invention.
Figure 2:
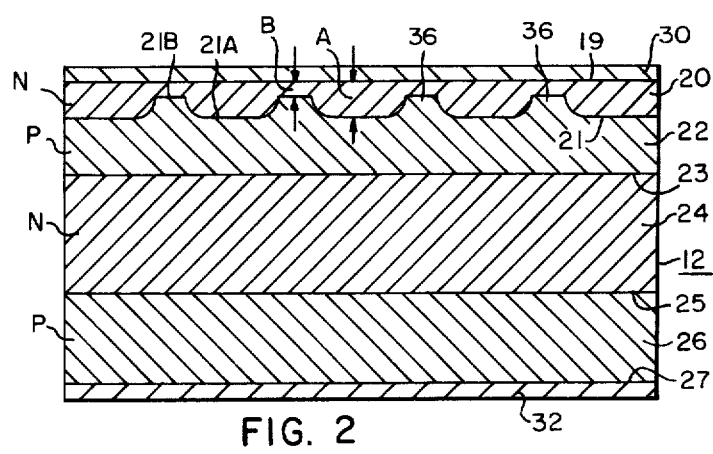
FIG. 2 is a cross-sectional view of the device of FIG. 1 taken along line II—II; and, FIGS. 3, 4 and 5 are plan views of various embodiments of the present invention.

FIGS. 1 and 2 illustrate a thyristor device comprising a body of semiconductor material 12 and electrical conductors disposed on the major surfaces of the body. The body 12 comprises four zones of alternate conductivity type: an emitter zone 20 of N-type conductivity is disposed adjacent to major surface 19, a base zone 22 of P-type conductivity forms PN junction 21 with emitter zone 20, a middle zone 24 of N-type conductivity forms PN junction 23 with base zone 22, an anode zone 26 of P-type conductivity forms PN junction 25 with middle zone 24 and extends to major surface 27. Emitter electrode 30 is affixed to the semiconductor body 12 at major surface 19. Anode electrode 32 is affixed to the body 12 at major surface 27.

Base zone 22 emerges at a portion of major surface 19 which is spaced apart from the portion of major surface 19 in contact with emitter electrode 30 as shown in FIG. 1. Base electrode 34 is affixed to the portion of major surface 19 where base zone 22 emerges.

In the present invention, low resistivity branches 36 comprise a portion of the base zone 22 and have a common origin in the portion of the base zone under base electrode 34, the branches 36 extending from their common origin under emitter zone 20. In the embodiment of FIGS. 1 and 2, the low resistivity branches 36 are regularly spaced and encompass a substantial portion of base zone 22.

It will be apparent to those skilled in the art that a complementary device may be produced by interchanging the P and N zones of the above-described embodiment.

The P and N dopings may be provided by known methods. For example, a starting material of N-type conductivity is doped with P-type impurities by diffusion to produce zones 22 and 26. Next, a two-step, single-sided diffusion is performed to produce two-level emitter zone 20. The first emitter zone diffusion step produces the deep portions of emitter zone 20 with a thickness designated by A as shown in FIG. 2. The porttions of the body 12 between the deep portions are masked by strips of silicon dioxide disposed on major surface 19 in the desired pattern of low resistivity branches. After removing the silicon dioxide mask, a second, more shallow diffusion is performed which produces a second thickness of emitter zone 20 designated by B as shown in FIG. 2, the low resistivity branches 36 being produced thereby. PN junction 21, being formed at the interface of zones 20 and 22, has a deep portion 21A and a shallow portion 21B.

As a natural result of the diffusion process which produced base zone 22, the concentration of P-type impurities in base zone 22 increases as the distance from major surface 19 decreases. Therefore, it should be apparent to those skilled in the art that the branches 36 have a lower resistivity than the remaining portions of base zone 22 under emitter zone 20. Consequently, the branches 36 perform the same function as low resistivity branches of the prior art while eliminating the need for complex emitter electrodes and complex epitaxial processes.

Following diffusion of the semiconductor body 12, electrodes 30, 32 and 34 are affixed to the major surfaces 19 and 27 as shown by any of several processes known in the art, such as vapor deposition or currentless metallization. As mentioned above, it is an advantage of the present invention over prior art devices that emitter electrode 30 need not have a complex geometry which matches a pattern of low resistivity branches. Consequently, as shown in FIG. 1, the electrode 30 covers most of the area of major surface 19 including the portions of emitter zone 20 over the branches 36 which has obvious advantages in thermal and electrical performance. Emitter electrode 30 does not contact that portion of the surface where base zone 22 emerges. PN junction 21, which separates zones 20 and 22, should not be bridged by electrodes 30 and 34 at major surface 19. Electrodes 30 and 34 are therefore spaced a safe distance from PN junction 21.

Figure 3:
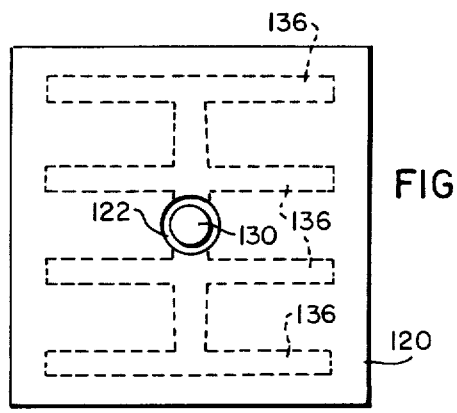

FIG. 3 illustrates an alternate embodiment of the present invention. For ease of illustration, the figure depicts the top surface of the semiconductor body without an emitter electrode. Low resistivity branches 136 take the shape of a double-sided comb. Emitter region 120 covers the entire major surface with the exception of a centrally-located circular portion where base region 122 emerges to make contact with base electrode 130 as shown.

Figure 4:
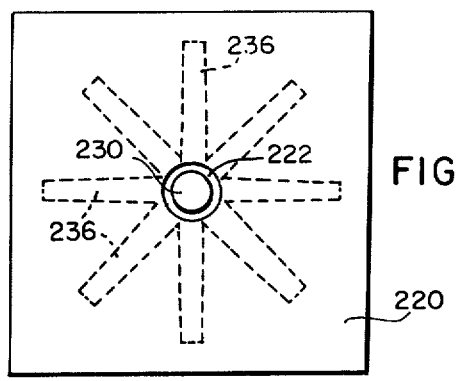

The embodiment of FIG. 4 is similar to the embodiment of FIG. 3, like numerals designating like parts, the only exception being that the low resistivity branches 236 take the shape of spokes extending radially outwards from a centrally-located base electrode 230.

Figure 5:
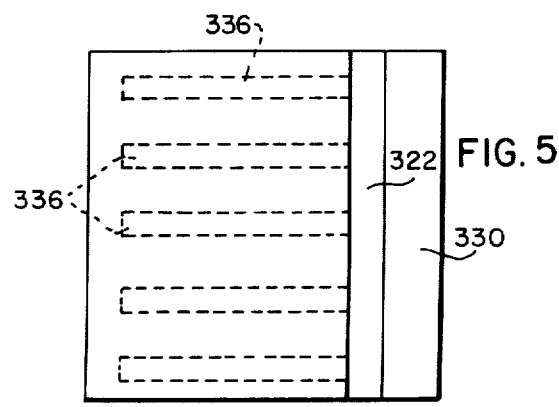

In the embodiment of FIG. 5, the low resistivity branches 336 take the shape of a single-sided comb. Emitter region 320 covers the teeth of the comb, and base region 322 emerges at the major surface along one edge of the semiconductor body where base electrode 330 is affixed.

Referring again to FIG. 2, the critical parameters of the novel features of the present invention will now be defined.

In order to achieve a sufficiently low resistivity in branches 36 as well as a sufficiently high breakdown voltage of PN junction 21, it is presently preferred that thickness A of emitter zone 20 be about 15 to 20 microns and thickness B of emitter zone 20 be about 1 micron; further, it is preferred that the doping concentration along portion 21A of PN junction 21, be about $5 \times 10^{17}$ /cm$^3$ and the doping concentration along portion 21B of PN junction 21 be about $1 \times 10^{19}$ /cm$^3$. The above dimensions and concentrations produce an electrical breakdown voltage of about 4 volts for PN junction 21.

It may be desirable to have a slightly higher electrical breakdown voltage for PN junction 21 for certain applications, in which case a thickness B of about 8 microns and a concentration of about $1 \times 10^{18}$/cm$^3$ along portion 21B produces an electrical breakdown voltage of about 6 volts for PN junction 21.

It will be recognized by those practicing in the art that the above-described embodiments of the present invention provide a novel advance in the art of semiconductor thyristor devices.

I claim:
1. A thyristor device comprising a body of semiconductor material and electrical conductor means;

said body of semiconductor material comprising at least one emitter zone disposed along a major surface of said body, a base zone disposed in said body adjacent to and in PN junction forming relationship with said emitter zone, said base zone having a first portion under said emitter zone and a second portion emerging at said major surface;

said electrical conductor means comprising an emitter electrode affixed to said emitter zone at said major surface, a base electrode affixed to said second portion of said base zone at said major surface;

a plurality of branches in said first portion of said base zone, said branches having a common origin in said second portion of said base zone under said base electrode, said emitter zone having portions of a first thickness above said branches, said emitter zone having portions of a second thickness separating said branches, said second thickness exceeding said first thickness, said base zone having a doping concentration increasing uniformly in a direction toward said major surface.

2. A thyristor device in accordance with claim 1 wherein a number of said branches of said base zone are regularly spaced in parallel and are interconnected by at least one branch perpendicularly disposed to said parallel branches.

3. A thyristor device in accordance with claim 1 wherein said first thickness of said emitter zone above said branches is about 1 micron.

4. A thyristor device in accordance with claim 1 wherein said first thickness of said emitter zone above said branches is about 8 microns.

5. A thyristor device comprising a body of semiconductor material and electrical conductor means;

said body of semiconductor material comprising at least one emitter zone disposed along a major surface of said body, a base zone disposed in said body adjacent to and in PN junction forming relationship with said emitter zone, said base zone having a first portion under said emitter zone and a second centrally located portion emerging at said major surface;

said electrical conductor means comprising an emitter electrode affixed to said emitter zone at said major surface, a base electrode affixed to said second centrally located portion of said base zone at said major surface;

a plurality of branches in said first portion of said base zone, said branches having a common origin in said second centrally located portion of said base zone, said branches extending radially outwards under said emitter zone, said emitter zone having portions of a first thickness above said branches, said emitter zone having portions of a second thickness separating said branches, said second thickness exceeding said first thickness, said base zone having a doping concentration increasing uniformly in a direction toward said major surface.

* * * * *